United States Patent [19]
Kobayashi et al.

[11] Patent Number: 5,863,659
[45] Date of Patent: Jan. 26, 1999

[54] SILICON WAFER, AND METHOD OF MANUFACTURING THE SAME

[75] Inventors: Norihiro Kobayashi; Katsunori Koarai, both of Annaka, Japan

[73] Assignee: Shin-Etsu Handotai Co., Ltd., Tokyo, Japan

[21] Appl. No.: 826,440

[22] Filed: Mar. 24, 1997

[30]     Foreign Application Priority Data

Mar. 28, 1996  [JP]  Japan .................................. 8-099371

[51] Int. Cl.$^6$ ............................ B32B 9/04; H01L 21/322
[52] U.S. Cl. ........................ 428/446; 257/627; 257/628; 428/620; 428/641; 438/457; 438/471; 438/476
[58] Field of Search .................................. 428/620, 641, 428/446; 427/588; 438/471, 476, 457, 455; 257/756, 627, 628

[56]    References Cited

U.S. PATENT DOCUMENTS

| | | | |
|---|---|---|---|
| 4,053,335 | 10/1977 | Hu | 148/174 |
| 4,608,096 | 8/1986 | Hill | 148/33 |
| 5,189,508 | 2/1993 | Tachimori et al. | 257/49 |
| 5,374,842 | 12/1994 | Kusakabe | 257/487 |
| 5,419,786 | 5/1995 | Kokawa et al. | 148/33.5 |
| 5,449,532 | 9/1995 | Toyokawa | 427/255 |

OTHER PUBLICATIONS

Patent Abstracts of Japan, vol. 095, No. 004, 31 May 1995.
Patent Abstracts of Japan vol. 017, No. 178 (E–1347), 7 Apr. 1993.
Patent Abstracts of Japan, vol. 014, No. 012 (E–871) 11 Jan. 1989.
"Continuous Gettering of Contaminants Using Multiple Polysilicon Films", IBM Technical Disclosure Bulletin, vol. 33, No. 11, 1 Apr. 1991, pp. 400–401.

*Primary Examiner*—Paul J. Thibodeau
*Assistant Examiner*—Holly C. Rickman
*Attorney, Agent, or Firm*—Oliff & Berridge, PLC

[57]    ABSTRACT

A silicon wafer has a polycrystalline silicon film formed on one main surface. The polycrystalline silicon film has a multilayer structure composed of X layers (X is an integer equal to or greater than two) containing <220> oriented components in different proportions. The proportion of the <220> oriented component in the first polycrystalline silicon layer in contact with the silicon wafer is larger than the respective proportions of the <220> oriented components in the second to X-th polycrystalline silicon layers superposed on the first polycrystalline silicon layer. It becomes possible to provide a silicon wafer whose polycrystalline silicon film possesses high gettering capability and in which stress acting on the silicon wafer is decreased.

8 Claims, 5 Drawing Sheets

SILICON WAFER, AND METHOD OF MANUFACTURING THE SAME

BACKGROUND OF THE INVENTION

1. Field of the Invention

The present invention relates to a silicon wafer and its manufacturing method. More particularly, the present invention relates to a silicon wafer having a polycrystalline silicon film for use in gettering operations which is formed on the main surface (hereinafter referred to as a "reverse surface") opposite the main surface (hereinafter referred to as a "front surface") on which semiconductor devices are fabricated, as well as to a method of manufacturing the silicon wafer.

2. Description of the Related Art

For various reasons, impurities such as heavy metals are generated during fabrication of a semiconductor device from a silicon wafer, and the thus-generated impurities contaminate the vicinity of the surface of a silicon wafer which will become an active area in the semiconductor device. If the vicinity of the surface of the silicon wafer which will become an active area is contaminated by impurities, the characteristics of the device are degraded, which in turn reduces the proportion of non-defective devices. To prevent such a problem, a technique of intentionally collecting impurities outside of the active area; namely, a gettering technique, is commonly used. A representative method of the gettering technique is the forming of polycrystalline silicon film for use in gettering operations on the reverse surface of a silicon wafer.

According to this conventional method, a polycrystalline silicon layer is usually formed by growing polycrystalline silicon on the reverse surface of the silicon using a LPCVD (Low Pressure Chemical Vapor Deposition) method. The characteristics of the polycrystalline silicon film thus formed as a gettering film by the low pressure chemical vapor deposition method are represented by the stress acting on the silicon wafer, as well as by the gettering capability.

Specifically, the polycrystalline silicon film imposes stress on the silicon wafer having the polycrystalline silicon film formed on the reverse surface thereof. As a result, as opposed to a silicon wafer without a polycrystalline silicon layer, the silicon wafer having a polycrystalline layer becomes warped to a great extent.

Considerable warpage of the wafer presents a problem in the process of fabricating semiconductor devices, and hence there is a demand for a silicon wafer having a polycrystalline film which reduces the stress acting on the silicon wafer.

Particularly, even if a given magnitude of stress imposed on a silicon wafer by the polycrystalline silicon film is identical, the warpage developed in the silicon wafer becomes greater with increasing diameter of the silicon wafer. Associated with a recent tendency of semiconductor devices to be highly integrated with higher accuracy, the diameter of the silicon wafer is steadily increasing. Because of this, it is to be desired that the warpage of the silicon wafer be reduced to as small an extent as possible.

Figure 5:
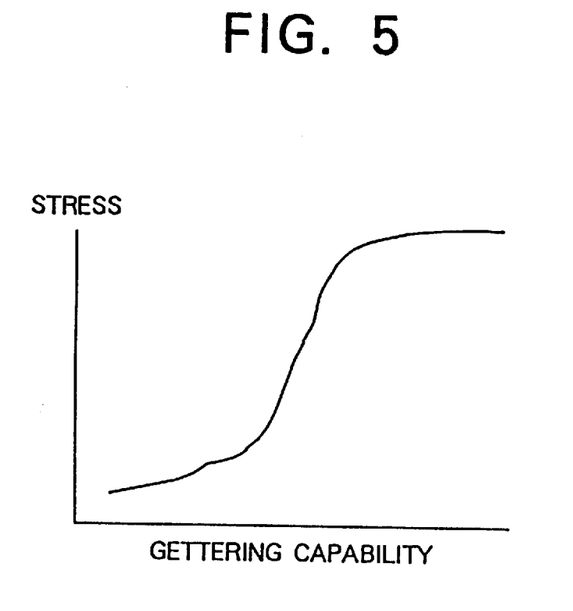
FIG. 5 is a graph illustrating the relationship between the gettering capability and the stress.

As illustrated in FIG. 5, if an attempt is made to reduce the stress acting on the silicon wafer, the gettering capability of the polycrystalline silicon layer decreases. The relationship between the stress and the gettering capability remains unchanged even with changes in parameters; e.g., the temperature and pressure within a chamber used for low pressure chemical vapor deposition, and a flow rate of $SiH_4$ (which is reaction gas). For this reason, it has been deemed that the stress acting on the silicon wafer cannot be reduced without decreasing the gettering capability of the polycrystalline silicon film.

Figure 3:
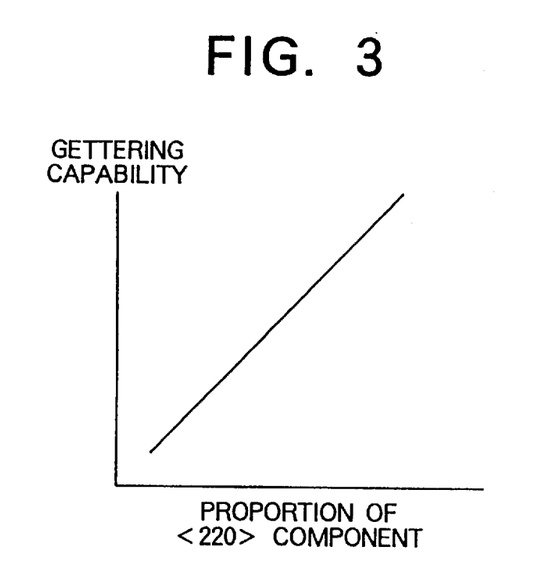
FIG. 3 is a graph illustrating the relationship between the proportion of the <220> oriented component and the gettering capability of the polycrystalline silicon film.
Figure 4:
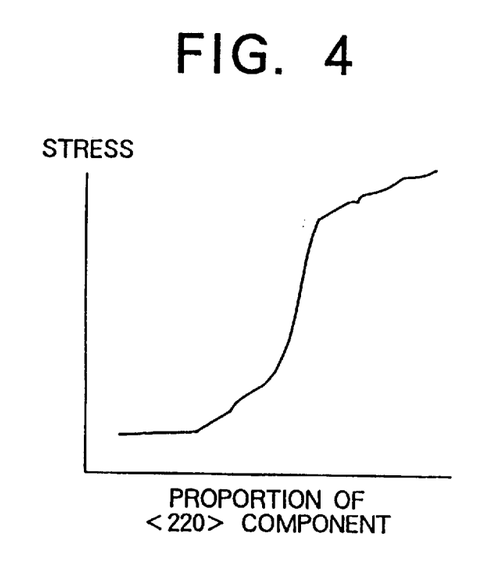
FIG. 4 is a graph illustrating the relationship between the proportion of the <220> oriented component and the stress acting on a silicon wafer.

As illustrated in FIGS. 3 and 4, when attention is directed to a proportion of a component in the polycrystalline silicon film which have a <220> orientation (hereinafter referred to as the "<220> oriented component"), the gettering capability of the polycrystalline silicon film is improved with an increase in the proportion of the <220> oriented component, and the stress acting on the silicon wafer becomes greater, as well. The reason for this is as follows: Namely, the polycrystalline silicon film is composed of silicon crystal of various grain sizes, and silicon crystal of small grain size contains a large amount of <220> oriented component. The smaller the grain size of silicon crystal, the greater the surface area of grain boundaries. As a result of this, the number of getter sites increases, and hence the gettering capability of the polycrystalline silicon film also increases. At the same time, as the grain size of silicon crystal decreases, the stress produced between grains increases, so that the stress which the polycrystalline silicon film imposes on the silicon wafer increases.

As disclosed in Japanese Patent Application Laid-Open (kokai) No. 4-333238, there already exists a technique which is intended to improve the gettering capability of a polycrystalline silicon film by increasing the amount of the <220> oriented component in the polycrystalline silicon film. As previously described, this technique has a drawback; i.e., an increase in the stress acting on the silicon wafer, which thereby increases warpage of the wafer.

SUMMARY OF THE INVENTION

Figure 1:
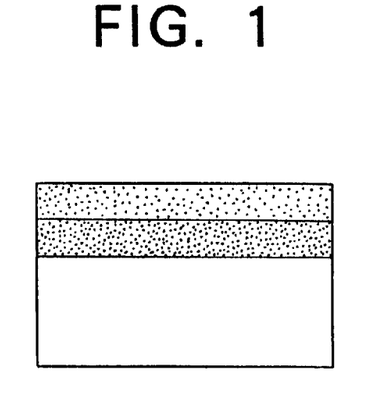
FIG. 1 is a partial cross-sectional view illustrating one example of a silicon wafer having a double-layer polycrystalline silicon film according to the present invention.
Figure 2:
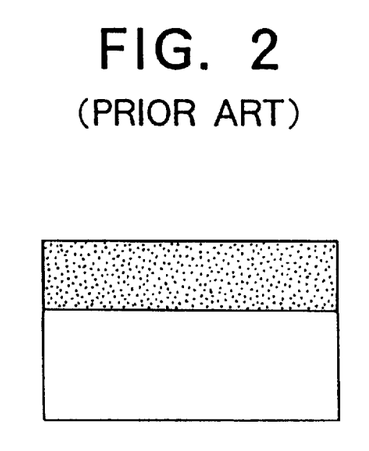
FIG. 2 is a partial cross-sectional view illustrating one example of a silicon wafer having a conventional single-layer polycrystalline silicon film.

Through various studies conducted by the inventors of the present invention in light of the aforementioned drawbacks, the inventors have discovered the following phenomena:

When a polycrystalline silicon film is formed into a multilayer structure (FIG. 1 illustrates an example of a two-layer structure) composed of a plurality of superposed polycrystalline silicon layers containing <220> oriented components in different proportions as illustrated in FIG. 1 instead of into a conventional single layer structure as illustrated in FIG. 2 and the proportion of the <220> oriented component in the first polycrystalline silicon layer in contact with a silicon wafer is made larger than the proportions of the <220> oriented components in the second or subsequent polycrystalline silicon layers superposed on the first layer, it becomes possible to reduce the stress acting on the silicon wafer without reducing the gettering capability of the polycrystalline silicon film, or to improve the gettering capability of the polycrystalline silicon film without changing the stress acting on the silicon wafer.

The above-described phenomena result from the following phenomena, namely;

1) The proportion of the <220> oriented component in the overall multilayer polycrystalline silicon film is significantly dependent on the proportion of the <220> oriented component in the first polycrystalline silicon layer. If this is explained with reference to the case of; e.g., a double-layer polycrystalline silicon film, the proportion of the <220> oriented component in the overall double-layer polycrystalline silicon film becomes close to the proportion of the <220> oriented component in the first polycrystalline silicon layer rather than the average of the proportion of the <220> oriented component in the first polycrystalline silicon layer and the proportion of the <220> oriented component in the second polycrystalline silicon layer.

Therefore, if the proportion of the <220> oriented component in the first polycrystalline silicon layer is larger than the proportion of the <220> oriented component in the second polycrystalline silicon layer; the phenomenon is represented by the following expression, Proportion of the <220> oriented component in the overall double-layer polycrystalline silicon film > (Proportion of the <220> oriented component in the first polycrystalline silicon layer+Proportion of the <220> oriented component in the second polycrystalline silicon layer)/2 .

Consequently, the gettering capability of the overall double-layer polycrystalline silicon film becomes higher than the sum of the gettering capability of the first polycrystalline silicon layer and the gettering capability of the second polycrystalline silicon film.

2) The stress acting on the silicon wafer becomes the sum of the stresses which the respective polycrystalline silicon layers impose on the silicon wafer. This phenomenon is represented by the following expression in the case of the double-layer polycrystalline silicon film;

Stress which the overall double-layer polycrystalline silicon film imposes on the silicon wafer=Stress which the first polycrystalline silicon layer imposes on the silicon wafer+Stress which the second polycrystalline silicon layer imposes on the silicon wafer.

This expression is represented in terms of the proportion of the <220> oriented component as follows:

Stress which the overall double-layer polycrystalline silicon film imposes on the silicon wafer=Stress corresponding to (the proportion of the <220> oriented component in the first polycrystalline silicon layer+the proportion of the <220> oriented component in the second polycrystalline silicon layer)/2.

Figure 6:
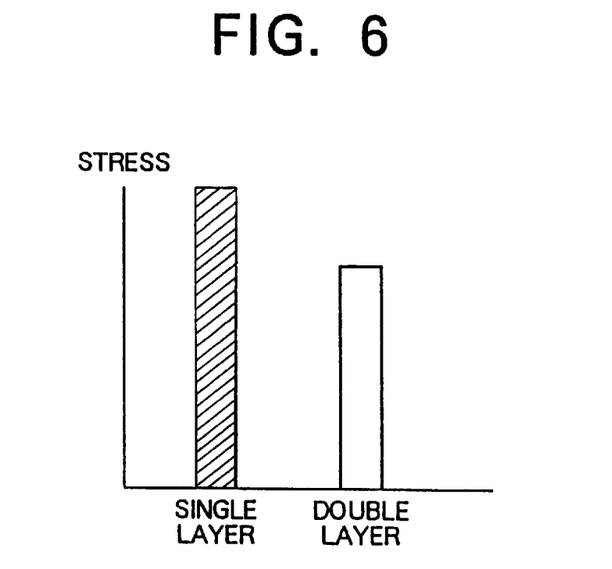
FIG. 6 is a graph illustrating the result of comparison between a single-layer polycrystalline silicon film and a double-layer polycrystalline silicon film in terms of stress acting on silicon wafers for the case where both silicon films include <220> oriented components in an identical proportion.

If the proportion of the <220> oriented component in the overall double-layer polycrystalline silicon film is the same as the proportion of the <220> oriented component in a single-layer polycrystalline silicon film having the same thickness as the double-layer polycrystalline silicon film, the average of the proportion of the <220> oriented component in the first polycrystalline silicon layer and the proportion of the <220> oriented component in the second polycrystalline silicon layer becomes smaller than the proportion of the <220> oriented component in the single-layer polycrystalline silicon film. Consequently, as illustrated in FIG. 6, the stress which the double-layer polycrystalline silicon film imposes on the silicon wafer becomes lower than that imposed by the single-layer polycrystalline silicon film.

Figure 7:
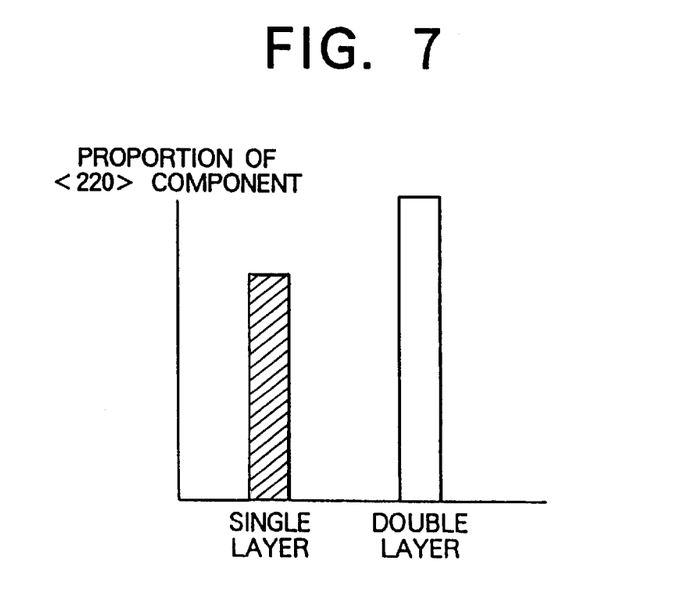
FIG. 7 is a graph illustrating the result of the comparison between the proportion of the <220> oriented component in the single-layer polycrystalline silicon film and that in the double-layer polycrystalline silicon film for the case where identical stress acts on the silicon wafers.

Conversely, as illustrated in FIG. 7, if the stress imposed on the silicon wafer by the overall double-layer polycrystalline silicon film is the same as the stress imposed on the silicon wafer by the single-layer polycrystalline silicon film which has the same thickness as for the double-layer polycrystalline silicon film, the proportion of the <220> oriented component in the overall double-layer polycrystalline silicon film becomes larger than that in the single-layer polycrystalline silicon film. In other words, the gettering capability of the double-layer polycrystalline silicon film becomes higher than that in the single-layer polycrystalline silicon film.

Accordingly, an object of the present invention is to provide a silicon wafer which has a polycrystalline silicon film for use in gettering operations being formed on one main surface (i.e., the reverse surface) of the silicon wafer and possessing high gettering capability, and which undergoes low stress, so that its warpage decreases.

To achieve the above object, the present invention provides an improved silicon wafer having a polycrystalline silicon film formed on one main surface (the reverse surface) thereof. The polycrystalline silicon film has a multilayer structure composed of X layers (X is an integer equal to or greater than two) containing <220> oriented components in different proportions. The proportion of the <220> oriented component in the first polycrystalline silicon layer in contact with the silicon wafer is larger than the respective proportions of the <220> oriented components in the second to X-th polycrystalline silicon layers superposed on the first polycrystalline silicon layer.

The preset invention also provides an improved method of manufacturing a silicon wafer having a polycrystalline silicon film formed on a first main surface (the reverse surface) thereof, wherein the polycrystalline silicon film is first formed on at least the first main surface (the reverse surface) of the silicon wafer, and a second main surface (the front surface) of the silicon wafer where semiconductor devices are fabricated is then mirror-polished. The polycrystalline silicon layer is formed by the steps of:

i) forming a first polycrystalline silicon layer on at least the first main surface of the silicon wafer; and ii) superposing second to X-th (X is an integer equal to or greater than two) polycrystalline silicon layers that contain <220> oriented components in different proportions smaller than that in the first polycrystalline silicon layer, on the first to (X−1)-th polycrystalline silicon layers, respectively.

Preferably, the proportion of the <220> oriented component in the first polycrystalline silicon layer is set so as to be 90% or more, and the proportions in the second to X-th polycrystalline silicon layers are set so as to be less than 90%. The reason for this is that these polycrystalline silicon films have sufficient gettering capability, and the stress exerted on the silicon wafer by them is reduced. Even in the case of a silicon wafer of large diameter, warpage arising in the silicon wafer falls within an allowable range.

More preferably, the proportion of the <220> oriented component in the first polycrystalline silicon layer is set so as to be 92% or more and particularly preferably to 95% or more. Further, the proportions of the <220> oriented components in the second to X-th polycrystalline silicon layers are set so as to be less than 80%, and particularly preferably to less than 70%.

In the present invention, it is desirable to form the polycrystalline silicon film into a double-layer structure. So long as the polycrystalline silicon film has a double-layer structure, it is possible to decrease the stress acting on the silicon wafer without decreasing the gettering capability of the polycrystalline silicon film. However, if the polycrystalline silicon film is formed into a film having three layers or more, the number of layer forming processes increases so that the productivity decreases.

According to the present invention, the stress acting on a silicon wafer can be reduced without decreasing the gettering capability of the polycrystalline silicon film. Therefore, it is possible to provide a silicon wafer which undergoes small warpage even if it has a large diameter and which has a polycrystalline silicon film that has high gettering capability and is formed on the reverse surface thereof.

DESCRIPTION OF PREFERRED EMBODIMENTS

Embodiments of the present invention will now be described.

Figure 8A:
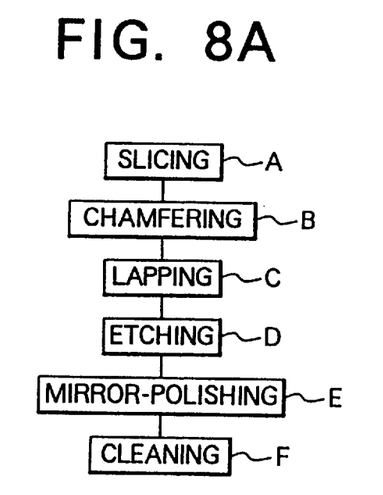
FIG. 8A is a flowchart illustrating an example of the processes (steps) of a silicon wafer manufacturing method by which a polycrystalline silicon film is not formed.

As illustrated in FIG. 8A, a silicon wafer manufacturing method usually comprises a slicing process A for slicing a silicon monocrystalline ingot manufactured by a monocrystal manufacturing apparatus into disk-shaped silicon wafers; a chamfering process B for chamfering the outer edge of each of the silicon wafers thus sliced in the slicing process A in order to prevent the silicon wafer from becoming cracked or chipped; a lapping process C for lapping the thus-chamfered silicon wafer so as to form a flat surface thereon; an etching process D for eliminating residual mechanical damage in both the front and reverse surfaces of the chamfered and lapped silicon wafer; a mirror-polishing process E for polishing the surface of the etched silicon wafer; and a cleaning process F for cleaning the mirror-polished surface of the silicon wafer so as to remove polishing material and foreign matter adhered thereto.

Figure 8B:
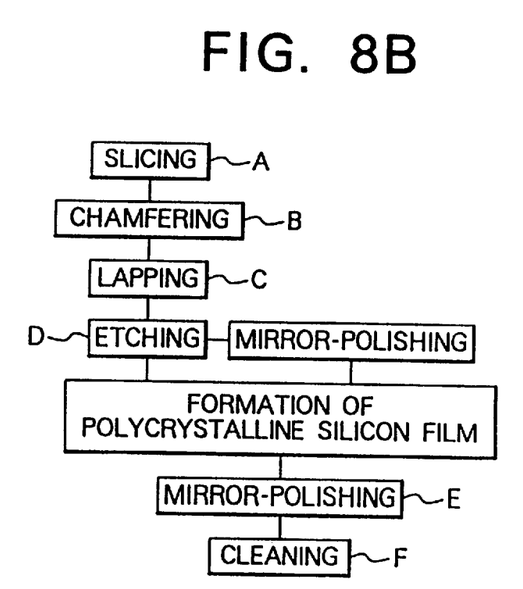
FIG. 8B is a flowchart illustrating an example of the processes (steps) of a silicon wafer manufacturing method by which a polycrystalline silicon film is formed.

As illustrated in FIG. 8B, a silicon wafer having a polycrystalline film formed on the reverse surface thereof of the present invention is usually manufactured by forming a polycrystalline film on the reverse surface of the silicon wafer using a low pressure chemical vapor deposition method after the silicon wafer has been etched in the etching process D, and by subsequently subjecting the silicon wafer to the mirror-polishing process E and the cleaning process F. Alternatively, the silicon wafer may be manufactured by mirror-polishing the reverse surface of the silicon wafer after the silicon wafer has been etched in the etching process D, and subsequently forming a polycrystalline film on the reverse surface of the silicon wafer using the low pressure chemical vapor deposition method, and then subjecting the silicon wafer to the mirror-polishing process E and the cleaning process F.

In the present invention, the polycrystalline silicon film is formed into a multilayer structure composed of a plurality of layered polycrystalline silicon layers containing <220> oriented components in different proportions, instead of into a single-layer structure consisting of a single polycrystalline silicon layer. An example of the manufacturing method will be described while using a double-layer polycrystalline silicon film as an example.

To form a polycrystalline silicon film on the reverse surface of the silicon wafer, an oxide film must exist on the reverse surface. Because of this, first, a silicon wafer having a native or chemically grown oxide film formed on the reverse surface thereof is prepared, or a thin oxide film is formed on the reverse surface of the silicon wafer by thermal oxidation or chemical vapor deposition.

Next, using the low pressure chemical vapor deposition method, polycrystalline silicon is deposited on the reverse surface of the silicon wafer where the oxide film has been formed, under the conditions that the proportion of the <220> oriented component increases; more preferably, that the proportion increases so as to be 90% or more, whereby the first polycrystalline silicon layer is formed. In this case, since the first polycrystalline silicon layer contains many silicon crystals of small grain size, the stress imposed on the silicon wafer by the thus-formed first polycrystalline silicon layer increases.

Using the low pressure chemical vapor deposition method, the polycrystalline silicon is further deposited on the first polycrystalline silicon layer, under the conditions that the proportion of the <220> oriented component in the second layer becomes smaller than that in the first polycrystalline silicon layer; more preferably, that the proportion becomes less than 90%, whereby the second polycrystalline silicon layer is superposed. In this event, the amount of silicon crystals of small grain size in the second polycrystalline silicon layer decreases in relation to that in the first polycrystalline silicon layer. Consequently, the stress imposed on the silicon wafer by the thus-formed second polycrystalline silicon layer is reduced in relation to the stress imposed by the first polycrystalline silicon layer.

The proportion of the <220> oriented component in the second polycrystalline silicon layer can be made smaller than that in the first polycrystalline silicon layer by; e.g., increasing the temperature within a chamber used for low pressure chemical vapor deposition at which the second polycrystalline silicon layer is superposed, in relation to the temperature at which the first polycrystalline silicon layer is formed. Alternatively, it is possible to make the proportion of the <220> oriented component in the second polycrystalline silicon layer smaller than that in the first polycrystalline silicon layer by changing parameters such as the pressure within the chamber for low pressure chemical vapor deposition or the flow rate of reaction gas.

As described above, after the multilayer polycrystalline silicon film has been formed on the reverse surface of the silicon wafer, the surface of the silicon wafer where semiconductor devices are fabricated is subjected to mirror polishing operations in the mirror-polishing process E. At this time, unwanted polycrystalline silicon adhered to the surface of the silicon wafer where semiconductor devices are fabricated is also removed.

When the polycrystalline silicon film is formed on the reverse surface of the silicon wafer through use of the low pressure chemical vapor deposition chamber, the polycrystalline silicon film is usually formed on the surface where semiconductor devices are fabricated, as well as on the reverse surface. Similarly, the oxide film is formed not only on the reverse surface but also on the front surface. However, for brevity, the "reverse surface" is mentioned as a representative throughout the specification.

EXAMPLE

First, four silicon wafers were sliced from a silicon monocrystal ingot manufactured by the Czochralski method (each slice had a diameter of 150 mm, a (100) main surface, a thickness of 630 μm, and a resistivity of 10 Ω·cm). The silicon wafers were entirely covered with a native oxide film. Before manufacturing proceeded to the next process, the warpage of each of the silicon wafers was measured.

Next, through use a low pressure chemical vapor deposition furnace, a multilayer polycrystalline silicon film was formed on one of the four silicon wafers under the conditions provided in Table 1 (Example of the Invention). Also, a single layer polycrystalline silicon film was formed on another silicon wafer under the conditions provided in Table 1 (Comparative Example). At the time of formation of the multilayer polycrystalline silicon film, the second polycrystalline silicon layer was superposed on the first polycrystalline silicon layer in an uninterrupted manner after formation of the first polycrystalline silicon layer without taking out the silicon wafer from the furnace.

TABLE 1

|  | Temperature in furnace (°C.) | Deposition thickness (μm) | Pressure within furnace (Pa) | Reaction gas | Gas flow rate (CC/min) |
|---|---|---|---|---|---|
| Example of the Invention |  |  |  |  |  |
| 1st layer | 620 | 0.75 | 10 | $SiH_4$ | 150 |
| 2nd layer | 680 | 0.75 | 10 | $SiH_4$ | 150 |
| Comparative Example | 650 | 1.50 | 10 | $SiH_4$ | 150 |

Since the polycrystalline silicon film had been formed further on the front surface, as well as on the reverse surface, the polycrystalline silicon film formed on the front surface was removed by mirror-polishing. Then, the warpage of the silicon wafer was measured again. The magnitude of the stress acting on the silicon wafer was calculated from the difference between the warpage measured before formation of the polycrystalline silicon film on the silicon wafer and the warpage measured after formation of the same. Further, the orientations of the thus-formed polycrystalline films were analyzed through use of an X-ray diffractometer to thereby calculate the ratio of a peak value of a <220> signal to the sum of peak values of <220>, <111>, and <311> orientation signals; i.e., the proportion of the <220> oriented component in the overall double-layer polycrystalline silicon film and the proportion of the <220> oriented component in the single-layer polycrystalline silicon film. Table 2 illustrates the results of such calculation.

TABLE 2

|  | Example of the Invention (double layer) | Comparative Example (single layer) |
|---|---|---|
| Stress (Pa) | $1.6–1.7 \times 10^8$ | $1.6–1.7 \times 10^8$ |
| (220) component (%) | 98 | 92 |

As can be seen from Table 2, even if the stress imposed on the silicon wafer by the double-layer polycrystalline silicon film is identical with that imposed by the single-layer polycrystalline silicon film, the proportion of the <220> oriented component in the overall double-layer polycrystalline silicon film becomes larger than that in the single-layer polycrystalline silicon film. Accordingly, it is understood that the gettering capability of the double-layer polycrystalline silicon film becomes higher than that in the single-layer polycrystalline silicon film which imposes the same amount of stress on the silicon wafer.

A double-layer polycrystalline silicon film and a single-layer polycrystalline silicon film were formed on the remaining two silicon wafers under the conditions that they included <220> oriented components in the same proportion. The stress imposed on the silicon wafer by the double-layer polycrystalline silicon film was lower than the stress imposed on the silicon wafer by the single-layer polycrystalline silicon film. Consequently, it is understood that the stress imposed on the silicon wafer by the double-layer polycrystalline silicon film becomes lower than the stress imposed on the silicon wafer by the single-layer polycrystalline silicon film having identical gettering capability.

The present invention is not limited to the above-described embodiment. The above-described embodiment is a mere example, and those having the substantially same structure as that described in the appended claims and providing the similar action and effects are included in the scope of the present invention.

What is claimed is:

1. A silicon wafer comprising:
   a polycrystalline silicon film formed on one main surface of said silicon wafer, the polycrystalline silicon film having a multilayer structure composed of X layers wherein X is an integer equal to or greater than two, that contain <220> oriented components in different proportions,
   wherein the proportion of the <220> oriented component in the first polycrystalline silicon layer in contact with the silicon wafer is larger than the respective proportions of the <220> oriented components in the second to X-th polycrystalline silicon layers superposed on the first polycrystalline silicon layer.

2. A coated silicon wafer according to claim 1, wherein the proportion of the <220> oriented component in the first polycrystalline silicon layer is equal to or greater than 90%, and the proportions in the second to X-th polycrystalline silicon layers are less than 90%.

3. A coated silicon wafer according to claim 1, wherein X is 2.

4. A coated silicon wafer according to claim 2, wherein X is 2.

5. A method of manufacturing a coated silicon wafer having a polycrystalline silicon film formed on a first main surface of said silicon wafer, said method comprising the steps of:
   i) forming a first polycrystalline silicon layer on at least a first main surface of the silicon wafer;
   ii) superposing second to X-th wherein X is an integer equal to or greater than two, polycrystalline silicon layers that contain <220> oriented components in different proportions smaller than that in the first polycrystalline silicon layer, on the first to (X–1)-th polycrystalline silicon layers, respectively, the first through X-th polycrystalline silicon layers forming said polycrystalline silicon film; and
   iii) mirror-polishing a second main surface of the silicon wafer on which semiconductor devices are fabricated.

6. A method of manufacturing a coated silicon wafer according to claim 5, wherein the proportion of the <220> oriented component in the first polycrystalline silicon layer is equal to or greater than 90%, and the proportions in the second to X-th polycrystalline silicon layers are less than 90%.

7. A method of manufacturing a coated silicon wafer according to claim 5, wherein X is 2.

8. A method of manufacturing a coated silicon wafer according to claim 6, wherein X is 2.

* * * * *